(12) United States Patent
Kim

(10) Patent No.: US 8,507,912 B2
(45) Date of Patent: Aug. 13, 2013

(54) ORGANIC LIGHT-EMITTING DISPLAY DEVICE AND METHOD OF MANUFACTURING THE SAME

(75) Inventor: Sung-Ho Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 197 days.

(21) Appl. No.: 13/096,211

(22) Filed: Apr. 28, 2011

(65) Prior Publication Data

US 2012/0074413 A1   Mar. 29, 2012

(30) Foreign Application Priority Data

Sep. 29, 2010   (KR) .................. 10-2010-0094465

(51) Int. Cl.
*H01L 27/32* (2006.01)

(52) U.S. Cl.
USPC .......... 257/59; 257/71; 257/72; 257/E33.001; 257/E27.001; 438/34

(58) Field of Classification Search
None
See application file for complete search history.

(56) References Cited

U.S. PATENT DOCUMENTS

| 2007/0278489 A1* | 12/2007 | Yamazaki et al. ............ 257/59 |
| 2009/0072711 A1 | 3/2009 | Cina et al. |
| 2009/0230399 A1* | 9/2009 | Sawamizu et al. ........... 257/59 |

FOREIGN PATENT DOCUMENTS

| JP | 2002246181 | 8/2002 |
| JP | 2005268046 | 9/2005 |
| JP | 2005310591 | 11/2005 |
| KR | 1020090120698 A | 11/2009 |

* cited by examiner

*Primary Examiner* — Fei Fei Yueng Lopez
(74) *Attorney, Agent, or Firm* — Robert E. Bushnell, Esq.

(57) ABSTRACT

An organic light-emitting display device includes an active layer of a thin film transistor (TFT) formed on a substrate; a gate electrode of the TFT, wherein a first gate electrode including a transparent conductive material, a first insulating layer, and a second gate electrode are sequentially stacked; a pixel electrode disposed on the first insulating layer and including the transparent conductive material; a source electrode and a drain electrode of the TFT, a second insulating layer disposed between the source electrode and the drain electrode; a light reflector including the same material as the source electrode and the drain electrode, and disposed on the pixel electrode; an emission layer disposed on top of the pixel electrode and surrounded by an inner side of the light reflector; and a counter electrode facing towards the pixel electrode, wherein the emission layer is disposed between the pixel electrode and the counter electrode.

23 Claims, 7 Drawing Sheets

US 8,507,912 B2

ORGANIC LIGHT-EMITTING DISPLAY DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 29 Sep. 2010 there duly assigned Serial No. 10-2010-0094465.

BACKGROUND OF THE INVENTION

1. Field of the Invention

An embodiment of the present invention relates to an organic light-emitting display device and a method of manufacturing the organic light-emitting display device.

2. Description of the Related Art

Organic light-emitting display devices are attracting attention as next generation display devices because not only the organic light-emitting display devices are lighter and thinner, but also the organic light-emitting display devices have a wider viewing angle, quicker response speeds, and lower power consumption.

Light emitted from an emission layer of the organic light-emitting display device is generally emitted without certain directivity, and is emitted in random directions in statistically uniform distribution. A considerable number of photons emitted in random directions do not reach an actual observer due to total internal reflection of the organic light-emitting display device, and thus light extraction efficiency of the organic light-emitting display device may be unsatisfactorily reduced.

SUMMARY OF THE INVENTION

One embodiment of the present invention provides an organic light-emitting display device having a simple manufacturing process and an excellent display quality, and a method of manufacturing the same.

In accordance with an aspect of the present invention, an organic light-emitting display device may include an active layer of a thin film transistor formed on a substrate; a gate electrode of the thin film transistor, wherein a first gate electrode including a transparent conductive material, a first insulating layer, and a second gate electrode including a metal are sequentially stacked; a pixel electrode disposed on the first insulating layer and the pixel electrode including a transparent conductive material; a source electrode and a drain electrode of the thin film transistor, which are electrically connected to the active layer, wherein a second insulating layer is disposed between the source electrode and the drain electrode; a light reflector including the same material as the source electrode and the drain electrode, and the light reflector being disposed at an upper edge of the pixel electrode; an emission layer disposed on top of the pixel electrode and an inner side of the light reflector; and a counter electrode facing towards the pixel electrode, wherein the emission layer is disposed between the pixel electrode and the counter electrode.

The light reflector may have a closed loop shape. The light reflector may surround the emission layer.

A thickness of the light reflector may be equal to or greater than a thickness of the emission layer.

A thickness of the light reflector may be equal to each thickness of the source electrode and the drain electrode.

The light reflector may be formed inside an opening formed by etching the second insulating layer and the light reflector may be disposed on top of the pixel electrode.

The light reflector may have an inverse tapered shape in such a way that a thickness of the light reflector far away from the pixel electrode is thicker than a thickness of the light reflector closer to the pixel electrode.

The light reflector may include a metal of at least two layers having different etching rates when the light reflector is subjected to an etching process.

The metal may have a higher etching rate near the pixel electrode than far from the pixel electrode.

The organic light-emitting display device may further include a third insulating layer between the source and drain electrodes and the counter electrode, and between the light reflector and the emission layer.

The organic light-emitting display device may further include a third insulating layer between the source and drain electrodes and the counter electrode, and a fourth insulating layer between the light reflector and the emission layer, wherein the fourth insulating layer has a higher light transmittance than the third insulating layer.

The third insulating layer may include an organic insulating material and the fourth insulating layer may include an inorganic insulating material.

The transparent conductive material of the pixel electrode may be the same material as that of the first gate electrode.

The organic light-emitting display device may further include a second pixel electrode disposed on an upper edge of the transparent conductive material of the pixel electrode and including the same metal as the second gate electrode, wherein the light reflector is disposed on an inner side of the second pixel electrode, with the inner side of the second pixel electrode facing towards the emission layer.

The transparent conductive material may include at least one selected from the group consisting of indium tin oxide (ITO), indium zinc oxide (IZO), zinc oxide (ZnO), indium oxide (In2O3), indium gallium oxide (IGO), and aluminum zinc oxide (AZO).

End shapes of etched surfaces of the first and second gate electrodes may be the same.

The active layer may include an ion impurity-doped semiconductor.

The ion impurity-doped semiconductor may include amorphous silicon or polysilicon.

The organic light-emitting display device may further include a lower capacitor electrode including the same material as the active layer and formed on the same layer as the active layer; and an upper capacitor electrode including the same material as the first gate electrode and formed on the first insulating layer.

The lower capacitor electrode may include an ion impurity-doped semiconductor.

The counter electrode may be a reflective electrode that reflects light emitted from the emission layer.

In accordance with another aspect of the present invention, a method of manufacturing an organic light-emitting display device may include steps of forming an active layer on a substrate; sequentially stacking a first insulating layer, a transparent conductive material, and a metal on the active layer, and simultaneously forming a pixel electrode and a gate electrode of a thin film transistor by patterning the transparent conductive material and the metal; forming a second insulating layer on a resultant structure obtained through the sequential stacking and simultaneous forming, and forming a first opening exposing the transparent conductive material of the pixel electrode and source and drain regions of the active layer by patterning the second insulating layer; forming a metal layer on a resultant structure obtained through the forming of the second insulating layer and forming of the first opening, and simultaneously forming source and drain electrodes, which contact the source and drain regions by patterning the metal layer, and a light reflector on the transparent conductive material of the pixel electrode; and forming a third insulating layer on a resultant structure obtained through the forming of the metal layer and simultaneous forming, wherein the third insulating layer exposes the transparent conductive material of the pixel electrode.

The method may further include forming an emission layer in a second opening formed by the third insulating layer, and forming a counter electrode covering the emission layer.

In the step of forming of the metal layer and simultaneous forming, the metal layer may include a metal of at least two layers having different etching rates, and the etching rate may increase towards the pixel electrode.

The forming of the third insulating layer may further include forming a fourth insulating layer having a higher light transmittance than the third insulating layer between the second insulating layer and the third insulating layer, wherein the third and fourth insulating layers expose the transparent conductive material of the pixel electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, the present invention will be described more fully with reference to the accompanying drawings, in which exemplary embodiments of the invention are shown.

An organic light-emitting display device 1 constructed as an embodiment of the present invention will now be described with reference to FIGS. 1 and 2.

Figure 1:
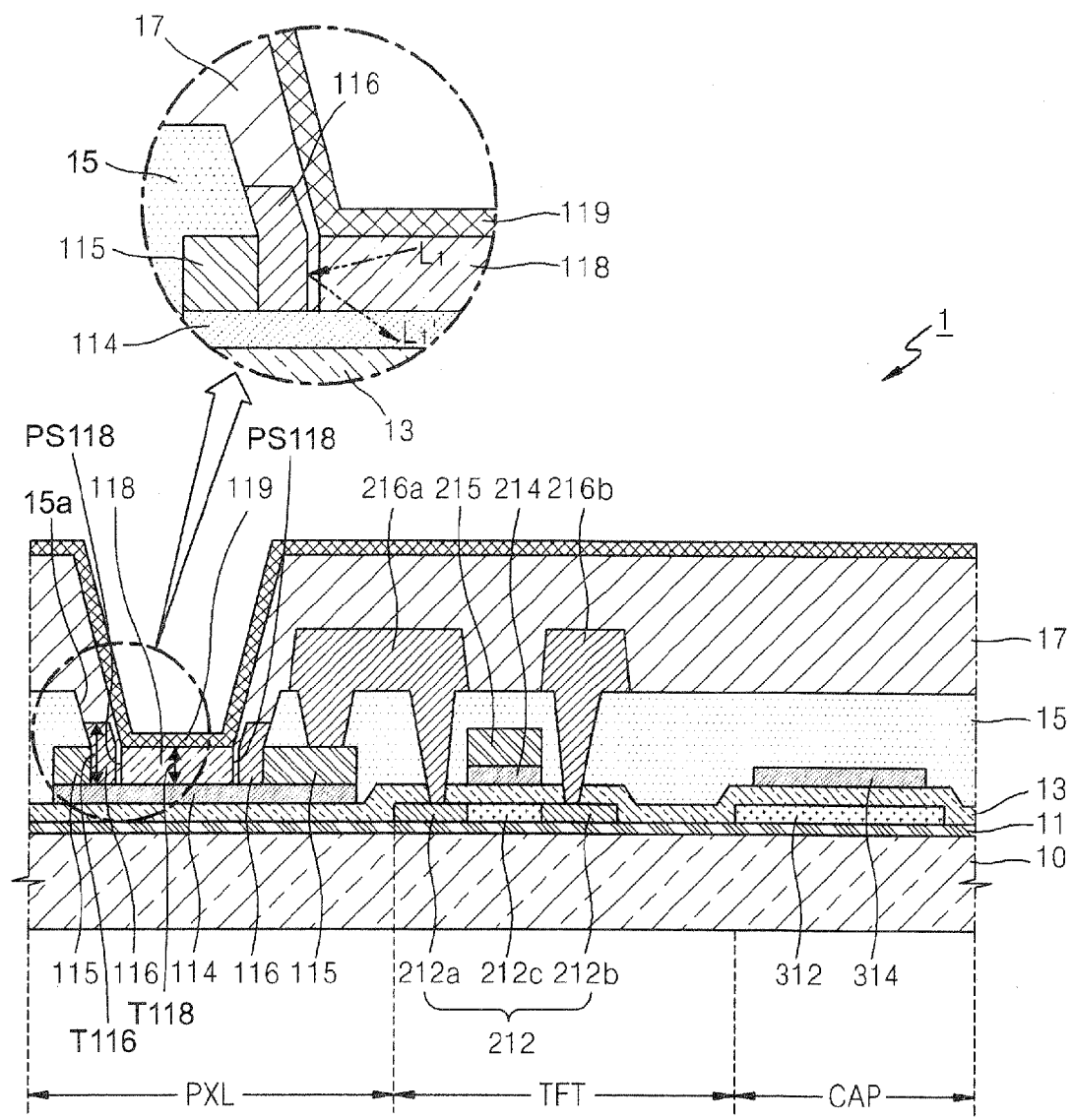
FIG. 1 is a cross-sectional view schematically illustrating an organic light-emitting display device constructed with an embodiment of the present invention.
Figure 2:
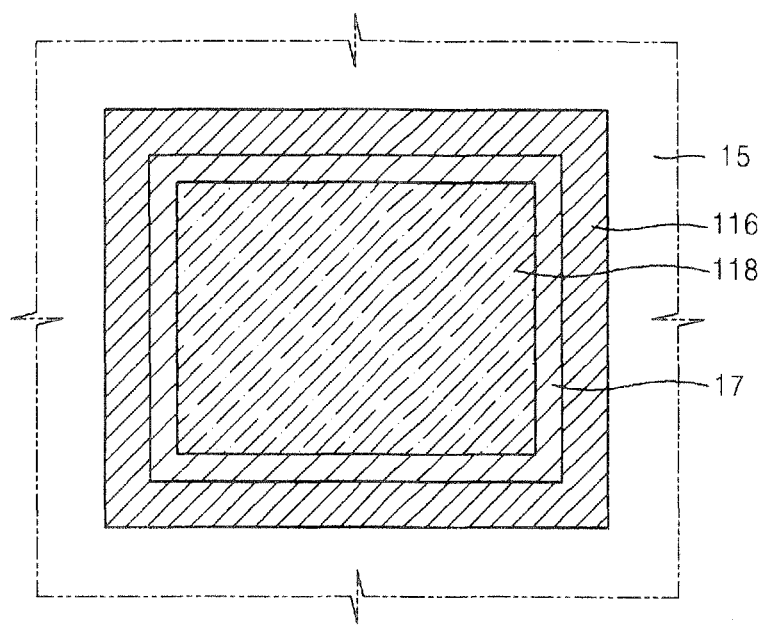
FIG. 2 is a plan view schematically illustrating a light reflector of FIG. 1.

FIG. 1 is a cross-sectional view schematically illustrating the organic light-emitting display device 1 constructed with an embodiment of the present invention, and FIG. 2 is a plan view schematically illustrating a light reflector 116 of FIG. 1.

Referring to FIG. 1, a pixel region PXL, including an emission layer 118, a transistor region TFT, including a thin film transistor, and a capacitor region CAP, including a capacitor are formed on a substrate 10.

An active layer 212 of the thin film transistor is disposed on the substrate 10 and a buffer layer 11, in the transistor region TFT. The active layer 212 is formed of a semiconductor including amorphous silicon or polysilicon, and may include source and drain regions 212a and 212b and a channel region 212c, which are doped with ion impurities.

On the active layer 212, a first gate electrode 214 and a second gate electrode 215, which include a transparent conductive material, are sequentially formed in a location corresponding to the channel region 212c of the active layer 212, wherein a first insulating layer 13 is disposed between the channel region 212c and the first and second gate electrodes 214 and 215.

Source and drain electrodes 216a and 216b respectively contacting the source and drain regions 212a and 212b of the active layer 212 are disposed on the first and second gate electrodes 214 and 215, wherein a second insulating layer 15 is disposed between the first and second gate electrodes 214 and 215, and the source and drain electrodes 216a and 216b. A third insulating layer 17, covering the second and drain electrodes 216a and 216b, is disposed on the second insulating layer 15.

In the capacitor region CAP, a lower capacitor electrode 312 which is formed of the same material as the active layer 212 of the thin film transistor, the first insulating layer 13, and an upper capacitor electrode 314 which is formed of the same material as a first pixel electrode 114, are sequentially disposed on the substrate 10 and the buffer layer 11. Accordingly, the lower capacitor electrode 312 is formed of the same material as the active layer 212 of the thin film transistor, and may include an ion impurity-doped semiconductor.

In the pixel region PXL, the first pixel electrode 114 formed of the same transparent electrically conductive material as the first gate electrode 214, and a second pixel electrode 115 formed of the same material as the second gate electrode 215 and disposed on an upper edge of the first pixel electrode 114, are sequentially disposed on the substrate 10, the buffer layer 11, and the first insulating layer 13.

In the present embodiment, the second pixel electrode 115 is disposed on the upper edge of the first pixel electrode 114, but a location of the second pixel electrode 115 is not limited thereto, and the second pixel electrode 115 may not be disposed on the first pixel electrode 114.

The organic light-emitting display device 1 further includes a counter electrode 119 facing the first pixel electrode 114, wherein the emission layer 118 is disposed between the first pixel electrode 114 and the counter electrode 119.

The emission layer 118 may be formed of a lower molecular weight organic material or a higher molecular weight organic material.

When the emission layer 118 is formed of a lower molecular weight organic material, the emission layer 118 may include a hole transport layer (HTL), a hole injection layer (HIL), an electron transport layer (ETL), and an electron injection layer (EIL). The emission layer 118 may include other layers if required. Here, examples of the lower molecular weight organic material include copper phthalocyanine (CuPc), N,N'-Di(naphthalene-1-yl)-N,N'-diphenyl-benzidine (NPB), and tris-8-hydroxyquinoline aluminum (Alq3).

Also, when the emission layer 118 is formed of a higher molecular weight organic material, the emission layer 118 may include an HTL. The HTL may be formed of poly-(2,4)-ethylene-dihydroxy thiophene (PEDOT) or polyaniline (PANI). Here, the higher molecular weight organic material may be a polyphenylene vinylene (PPV)-based or polyfluorene-based high molecular weight organic material.

The counter electrode 119 is deposited as a common electrode, on the emission layer 118. In the organic light-emitting display device 1 constructed as the present embodiment, the first and second pixel electrodes 114 and 115 may be used as an anode, and the counter electrode 119 is used as a cathode. However, polarities of the first and second pixel electrodes 114 and 115 and the counter electrode 119 may be the opposite.

The counter electrode 119 may be a reflective electrode including a reflective material. Here, the counter electrode 119 may include at least one material selected from the group consisting of aluminum (Al), magnesium (Mg), lithium (Li), calcium (Ca), lithium fluoride (LiF)/Ca, LiF/Al and the combinations thereof.

When the counter electrode 119 is a reflective electrode, light emitted from the emission layer 118 may be reflected by the counter electrode 119, penetrates through the first pixel electrode 114 formed of the transparent conductive material, and is emitted to the substrate 10.

On an outer region of the emission layer 118, the light reflector 116, formed of the same material as the source and drain electrodes 216a and 216b, is disposed on an upper edge of the first pixel electrode 114, wherein the third insulating layer 17 is disposed between the light reflector 116 and the first pixel electrode 114.

The light reflector 116 reflects light L1 reaching the light reflector 116, from among photons generated from the emission layer 118 and emitted in random directions, specifically from a boundary around the emission layer 118, thereby helping reflected light L1' to be emitted to the outside of the organic light-emitting display device 1.

Referring to FIGS. 1 and 2, the light reflector 116 is disposed in an opening 15a formed by etching the second insulating layer 15 on the first pixel electrode 114 and the light reflector 116 forms a closed loop surrounding the emission layer 118, wherein the third insulating layer 17 is disposed between the light reflector 116 and the emission layer 118. Accordingly, a maximum number of photons emitted from the emission layer 118 may be reflected by the reflector 116, and thus light extraction efficiency of the organic light-emitting display device 1 may be improved.

Also, as will be described later, a thickness of the light reflector 116 may be equal to each of the thicknesses of the source and drain electrodes 216a and 216b, since the light reflector 116 is simultaneously formed together with the source and drain electrodes 216a and 216b and with the same material as the source and drain electrodes 216a and 216b, during the same mask process. Here, the thicknesses of the source and drain electrodes 216a and 216b and the thickness T116 of the light reflector 116 may be thicker than the thickness T118 of the emission layer 118 so that the light reflector 116 may reflect as many photons emitted from the emission layer 118 as possible.

A method of manufacturing the organic light-emitting display device 1, according to an embodiment of the present invention, will now be described with reference to FIGS. 3A through 3E.

Figure 3A:
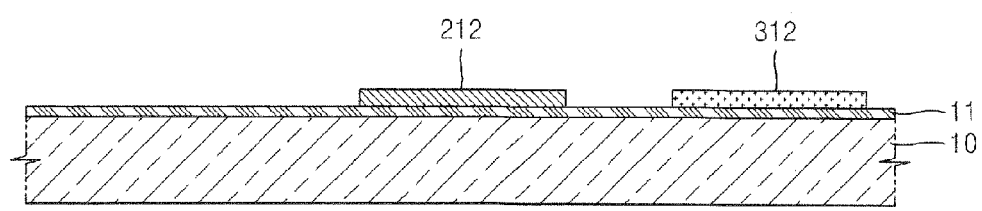
FIG. 3A is a cross-sectional view schematically illustrating a result of performing a first mask process of an organic light-emitting display device, according to an embodiment of the present invention.

FIG. 3A is a cross-sectional view schematically illustrating a result of performing a first mask process of the organic light-emitting display device 1, according to an embodiment of the present invention.

Referring to FIG. 3A, on the buffer layer 11 disposed on the substrate 10, the active layer 212 of the thin film transistor is formed in the transistor region TFT and the lower capacitor electrode 312 is formed in the capacitor region CAP.

The substrate 10 may be formed of transparent glass including silicon dioxide ($SiO_2$) as a main component, and the buffer layer 11, including $SiO_2$ and/or silicon nitride ($SiN_x$), may be further disposed on the substrate 10 so as to smoothen the substrate 10 and prevent impure elements from penetrating into the substrate 10.

Although not illustrated in FIG. 3A, the active layer 212 of the thin film transistor and the lower capacitor electrode 312 are simultaneously formed by depositing a semiconductor layer (not shown) on the buffer layer 11, coating a photoresist (not shown) on the semiconductor layer, and then patterning the semiconductor layer by using a first photo mask (not shown) in a photolithography process.

The first mask process according to the photolithography process is performed via a series of processes, such as developing, etching, and stripping or ashing, after exposing the first photo mask to light by using a light exposure device.

The semiconductor layer may include amorphous silicon or polysilicon. Here, the polysilicon may be formed by crystallizing the amorphous silicon. The amorphous silicon may be crystallized by using any method, such as a rapid thermal annealing (RTA) method, a solid phase crystallization (SPC) method, an excimer laser annealing (ELA) method, a metal-induced crystallization (MIC) method, a metal-induced lateral crystallization (MILC) method, and a sequential lateral solidification (SLS) method.

Figure 3B:
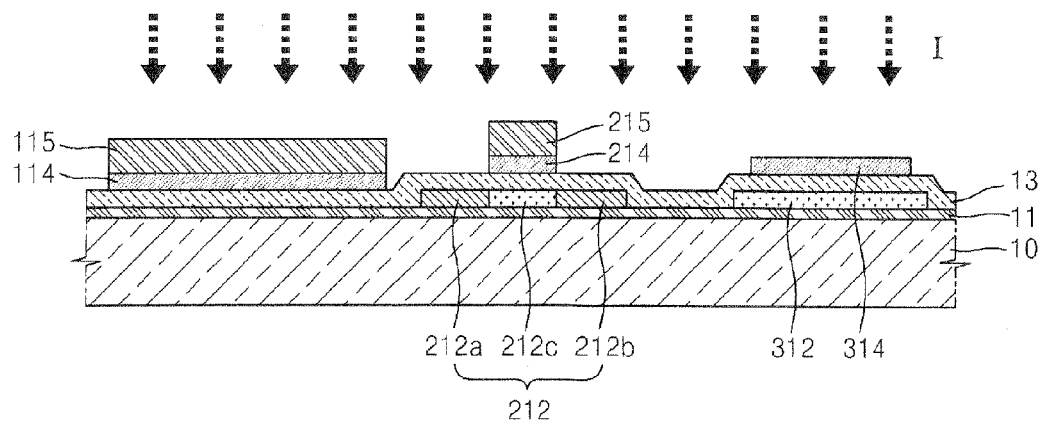
FIG. 3B is a cross-sectional view schematically illustrating a result of performing a second mask process of an organic light-emitting display device, according to an embodiment of the present invention.

FIG. 3B is a cross-sectional view schematically illustrating a result of performing a second mask process of the organic light-emitting display device 1, according to an embodiment of the present invention.

Referring to FIG. 3B, the first insulating layer 13 is stacked on a resultant structure obtained via the first mask process of FIG. 3A, and layers (not shown) including a transparent conductive material and a metal are sequentially stacked on the first insulating layer 13, and are patterned.

Accordingly, the first pixel electrode 114, including the transparent conductive material, and the second pixel electrode 115, including the metal, are sequentially formed on the first insulating layer 13 in the pixel region PXL, the first gate electrode 214, including the transparent conductive material, and the second gate electrode 215, including the metal, are sequentially formed on the first insulating layer 13 in the transistor region TFT, and the upper capacitor electrode 314, including the transparent conductive material, is formed on the first insulating layer 13 in the capacitor region CAP simultaneously with the first pixel electrode 114 and the first gate electrode 214. Accordingly, the first and second gate electrodes 214 and 215 have same pattern and boundary. Also, the first and second pixel electrodes 114 and 115 have same pattern and boundary.

The first insulating layer 13 may include a single layer or multiple layers formed of SiO2, SiNx, or the like, and the first insulating layer 13 may operate as a gate insulating layer of a thin film transistor and a dielectric layer of a capacitor.

The transparent conductive material forming the first pixel electrode 114, the first gate electrode 214, and the upper capacitor electrode 314 may include at least one material selected from the group consisting of indium tin oxide (ITO), indium zinc oxide (IZO), zinc oxide (ZnO), indium oxide (In2O3), indium gallium oxide (IGO), aluminum zinc oxide (AZO) and the combinations thereof.

The metal forming the second pixel electrode 115 and the second gate electrode 215 may be a single layer or a plurality of layers of at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu).

In the current embodiment, a half-tone mask may be used as a second photo mask (not shown) during the second mask process so that metal layers, such as the second pixel electrode 115 and second gate electrode 215, are not formed on top of the upper capacitor electrode 314.

The resultant structure obtained as described above is doped with ion impurities I. B- or P-ions may be doped as the ion impurities I in a concentration of $1 \times 10^{15}$ atoms/cm$^2$ or above, while targeting the lower capacitor electrode 312, including the semiconductor, and the active layer 212 of the thin film transistor.

Accordingly, electrical conductivity of the lower capacitor electrode 312 is increased, thereby increasing capacity of the capacitor as the lower capacitor electrode 312, the first insulating layer 13, and the upper capacitor electrode 314 form a metal-insulator-metal (MIM) capacitor.

Also, the active layer 212 is doped with the ion impurities by using the first and second gate electrodes 214 and 215 as a self-aligned mask, and thus the active layer 212 includes the source and drain regions 212a and 212b, and the channel region 212c therebetween. In other words, the source and drain regions 212a and 212b are formed without having to add a separate photo mask, by using the first and second gate electrodes 214 and 215 as the self-aligned mask.

Figure 3C:
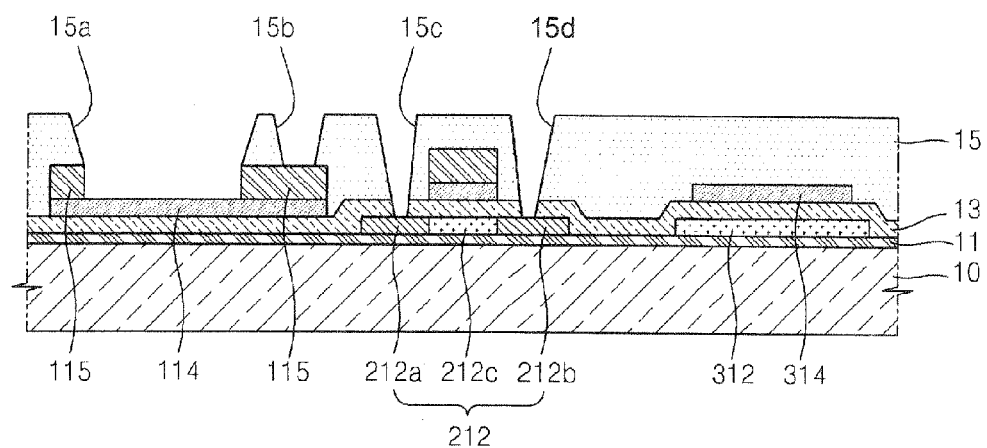
FIG. 3C is a cross-sectional view schematically illustrating a result of performing a third mask process of an organic light-emitting display device, according to an embodiment of the present invention.

FIG. 3C is a cross-sectional view schematically illustrating a result of performing a third mask process of the organic light-emitting display device 1, according to an embodiment of the present invention.

Referring to FIG. 3C, the second insulating layer 15 is stacked on a resultant structure obtained via the second mask process of FIG. 3B, and a first opening 15a exposing the first pixel electrode 114, a second opening 15b exposing the second pixel electrode 115, a third opening 15c exposing the source region 212a of the active layer 212, and a fourth opening 15d exposing the drain region 212b of the active layer 212 are formed by patterning the second insulating layer 15.

After patterning the second insulating layer 15 to form the first through fourth openings 15a through 15d, the second pixel electrode 115 exposed by the first opening 15a is removed. The second pixel electrode 115 may be etched by using an etchant for etching the second pixel electrode 115 including the metal, without having to perform a separate mask process. Alternatively, the second pixel electrode 115 may be removed during the second mask process.

Figure 3D:
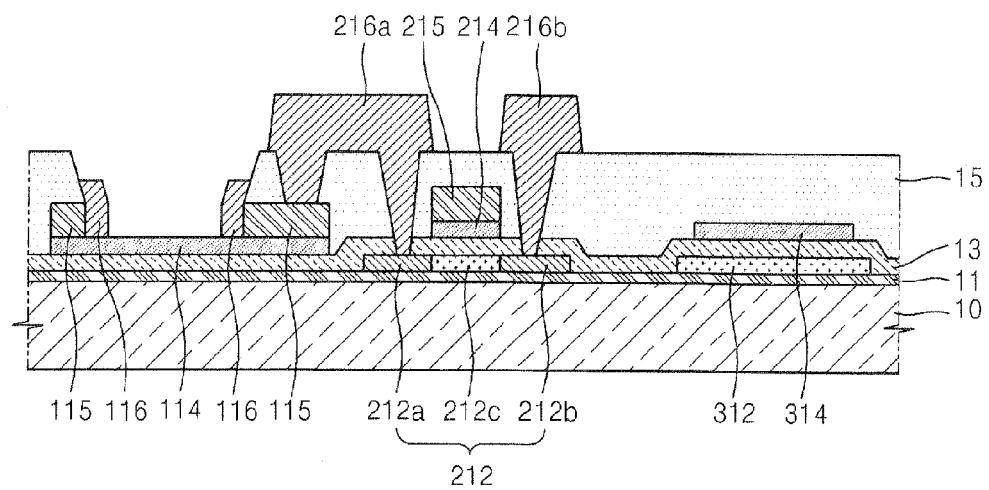
FIG. 3D is a cross-sectional view schematically illustrating a result of performing a fourth mask process of an organic light-emitting display device, according to an embodiment of the present invention.

FIG. 3D is a cross-sectional view schematically illustrating a result of performing a fourth mask process of the organic light-emitting display device 1, according to an embodiment of the present invention.

Referring to FIG. 3D, the source and drain electrodes 216a and 216b are formed on the second insulating layer 15 by filling the second through fourth openings 15b through 15d formed in the second insulating layer 15 of the transistor region TFT, and the light reflector 116, formed of the same material as the source and drain electrodes 216a and 216b, is formed in the first opening 15a formed in the second insulating layer 15 of the pixel region PXL.

The source and drain electrodes 216a and 216b, and the light reflector 116 may be formed of a single layer or a plurality of layers of at least one metal selected from the group consisting of Al, Pt, Pd, Ag, Mg, Au, Ni, Nd, Ir, Cr, Li, Ca, Mo, Ti, W, and Cu.

The light reflector 116 may be formed without having to perform a separate mask process, since the light reflector 116 is formed during the same mask process as the source and drain electrodes 216a and 216b and with the same material as the source and drain electrodes 216a and 216b. Since the source and drain electrodes 216a and 216b are formed of the metal and the metal has excellent reflexibility, reflexibility of the light reflector 116, formed of the same material as the source and drain electrodes 216a and 216b, is also excellent. Thus, light extraction efficiency of the organic light-emitting display device 1 is increased.

Figure 3E:
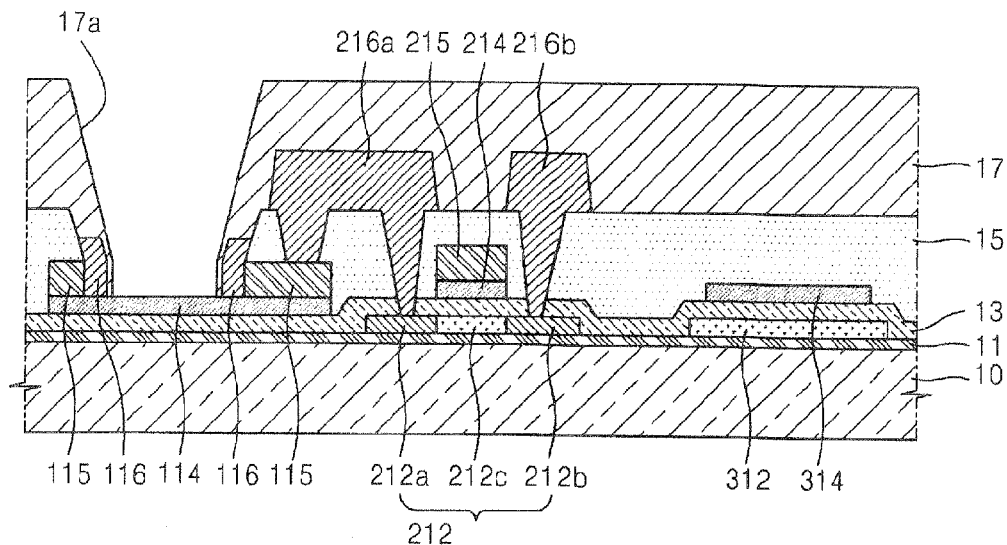
FIG. 3E is a cross-sectional view schematically illustrating a result of performing a fifth mask process of an organic light-emitting display device, according to an embodiment of the present invention.

FIG. 3E is a cross-sectional view schematically illustrating a result of performing a fifth mask process of the organic light-emitting display device 1, according to an embodiment of the present invention.

Referring to FIG. 3E, the third insulating layer 17 is stacked on a resultant structure obtained via the fourth mask process of FIG. 3D, and an opening 17a exposing the top of the first pixel electrode 114 is formed by patterning the third insulating layer 17.

Besides defining a light-emitting area, the opening 17a also prevents a short circuit of the first and second pixel electrodes 114 and 115 and the counter electrode 119 of FIG. 1 by increasing a distance between edges of the first and second pixel electrodes 114 and 115 and the counter electrode 119 to prevent an electric field from concentrating on the edges of the first and second pixel electrodes 114 and 115. Also, a short circuit that may be generated when the emission layer 118 of FIG. 1 and the light reflector 116 directly contact each other is prevented by disposing the third insulating layer 17 between the emission layer 118 and the light reflector 116. The third insulating layer 17 may be an organic insulating layer or an inorganic insulating layer. In one embodiment, the third insulating layer 17 may completely cover the exposed surface of the light reflector 116 of the resultant structure obtained via the fourth mask process of FIG. 3D.

In the organic light-emitting display device 1 of FIG. 1 according to the current embodiment, wherein the emission layer 118 of FIG. 1 and the counter electrode 119 of FIG. 1 are formed on a resultant structure obtained via the fifth mask process, light extraction efficiency of extracted light emitted from the emission layer 118 is high since the light reflector 116, formed of the metal having high reflexibility, surrounds the emission layer 118. In one embodiment, the light reflector 116 may surround the entirety of the peripheral surface PS 118 of the emission layer 118. Also, the light reflector 116 is simply formed without having to perform a separate and additional process, since the light reflector 116 is formed of the same material as the source and drain electrodes 216a and 216b during the same mask process. Also, the light extraction efficiency of extracted light emitted from the emission layer 118 may be increased by forming the thickness of the light reflector 116 thicker than the thickness of the emission layer 118.

Figure 6:
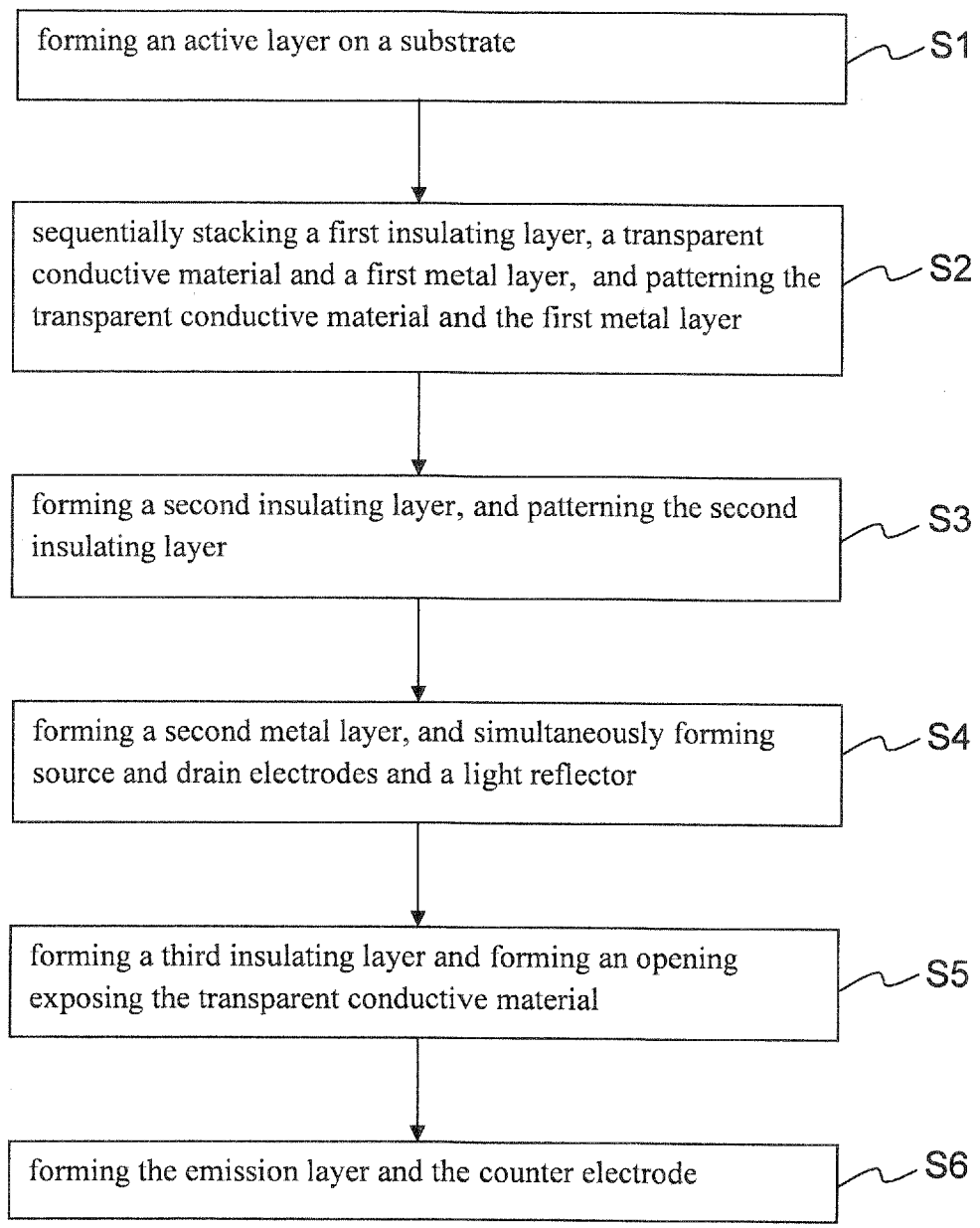
FIG. 6 is a flow chart showing the procedural steps for the manufacture of the organic light-emitting display devices.

FIG. 6 is a flow chart showing steps of manufacturing the organic light-emitting display device 1. The manufacturing procedural steps include steps for forming an active layer on a substrate (S1); sequentially stacking a first insulating layer, a transparent conductive material, and a first metal layer on the active layer, and simultaneously forming a pixel electrode and a gate electrode of a thin film transistor by patterning the transparent conductive material and the first metal layer (S2); forming a second insulating layer on a first resultant structure obtained by step S2 and simultaneous forming the pixel electrode and the gate electrode, and forming an opening exposing the transparent conductive material of the pixel electrode and source and drain regions of the active layer by patterning the second insulating layer (S3); forming a metal layer on a second resultant structure obtained by step S3, and simultaneously forming source and drain electrodes which respectively contact the source and drain regions by patterning the metal layer, and a light reflector disposed on the transparent conductive material of the pixel electrode (S4); and forming a third insulating layer on a third resultant structure obtained by step S4 and simultaneous forming the source and drain electrodes and the light reflector, wherein the third insulating layer exposes the transparent conductive material of the pixel electrode (S5).

Furthermore, the emission layer 118 is formed within the opening 17a of the third insulating layer 17 and the emission layer 118 is surrounded by the light reflector 116. The counter electrode 119 is formed to cover the third insulating layer 17 and the emission layer 118 (S6).

An organic light-emitting display device 2 constructed as another embodiment of the present invention will now be described with reference to FIG. 4.

Figure 4:
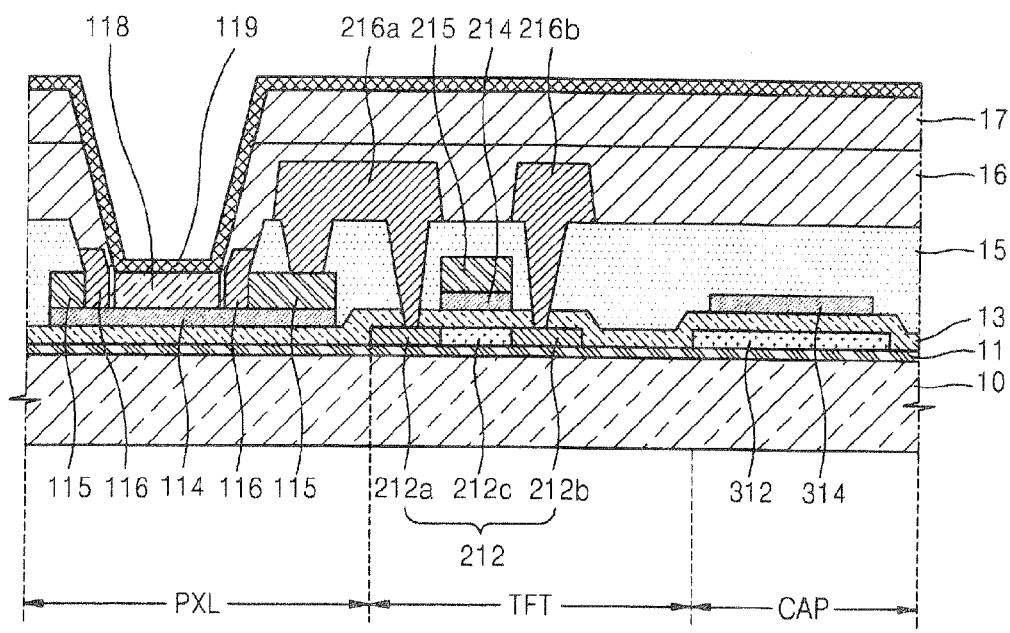
FIG. 4 is a cross-sectional view schematically illustrating an organic light-emitting display device constructed with another embodiment of the present invention.

FIG. 4 is a cross-sectional view schematically illustrating the organic light-emitting display device 2 according to another embodiment of the present invention. Differences between the organic light-emitting display device 1 and the organic light-emitting display device 2 will be mainly described. Like reference numerals denote like elements.

Referring to FIG. 4, the pixel region PXL including the emission layer 118, the transistor region TFT including the thin film transistor, and the capacitor region CAP including the capacitor, are formed on the substrate 10.

The active layer 212 of the thin film transistor and the lower capacitor electrode 312, formed of the same material as the active layer 212, are formed on the same layer, i.e., on the substrate 10 and the buffer layer 11. The first insulating layer 13 is formed to cover the active layer 212 and the lower capacitor electrode 212.

The first gate electrode 214 of the thin film transistor, including the transparent conductive material, and the second gate electrode 215, including the metal, are sequentially formed on the first insulating layer 13. The first pixel electrode 114, including the same transparent conductive material as the first gate electrode 214, and the second pixel electrode 115, including the same metal as the second gate electrode 215, are formed in the pixel region PXL, and the upper capacitor electrode 314, including the same transparent conductive material as the first gate electrode 214, is formed in the capacitor region CAP. The second insulating layer 15 is formed to cover the first and second pixel electrodes 114 and 115, the first and second gate electrodes 214 and 215, and the upper capacitor electrode 314.

The source and drain electrodes 216a and 216b respectively contacting the source and drain regions 212a and 212b of the active layer 212 are formed on the second insulating layer 15, and the light reflector 116, formed of the same material as the source and drain electrodes 216a and 216b, is formed in an opening formed in the second insulating layer 15 to expose the top of the first pixel electrode 114. A fourth insulating layer 16 and the third insulating layer 17 are sequentially formed to cover the light reflector 116 and the source and drain electrodes 216a and 216b.

The fourth insulating layer 16 directly contacting the light reflector 116 is formed of a material having a higher light transmittance in comparison with that of the third insulating layer 17. For example, if the third insulating layer 17 is an organic insulating layer, the fourth insulating layer 16 may be an inorganic insulating layer having a higher light transmittance than the organic insulating layer.

Accordingly, the organic light-emitting display device 2 according to the current embodiment has a higher light extraction efficiency than the organic light-emitting display device 1 according to the previous embodiment, since more photons emitted from the emission layer 118 may reach the light reflector 116 by passing through the fourth insulating layer 16 having higher light transmittance or lower light absorptance.

An organic light-emitting display device 3 according to another embodiment of the present invention will now be described with reference to FIG. 5.

Figure 5:
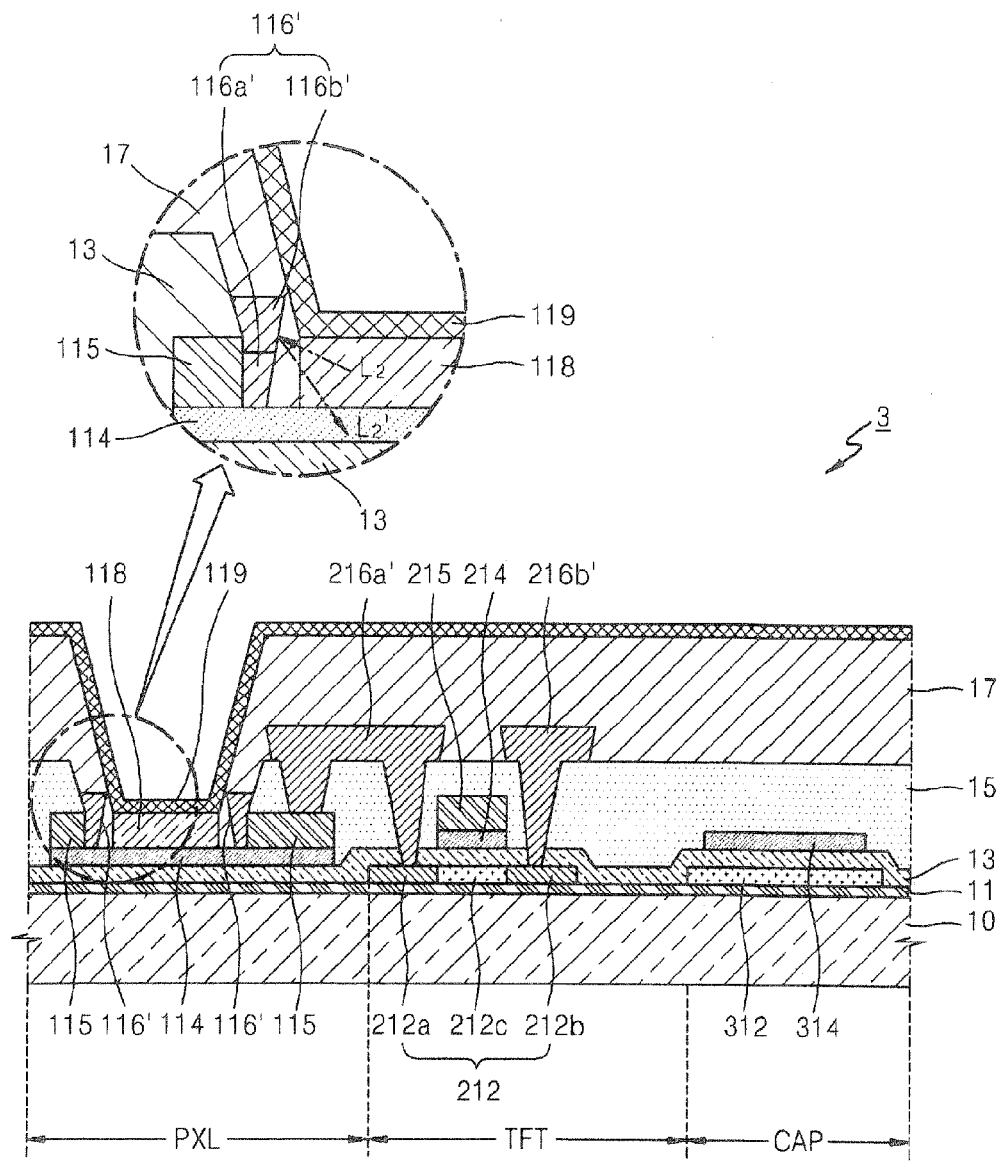
FIG. 5 is a cross-sectional view schematically illustrating an organic light-emitting display device constructed with another embodiment of the present invention.

FIG. 5 is a cross-sectional view schematically illustrating the organic light-emitting display device 3 according to another embodiment of the present invention. Differences between the organic light-emitting display device 1 and the organic light-emitting display device 3 will be mainly described. Like reference numerals denote like elements.

The organic light-emitting display device 3 according to the current embodiment is different from the organic light-emitting display device 1 according to the previous embodiment in shapes and structures of source and drain electrodes 216a' and 216b' and a light reflector 116'.

The source and drain electrodes 216a' and 216b' and the light reflector 116' of the organic light-emitting display device 3 according to the current embodiment are formed of a metal of at least two layers having different etching rates while being etched by an etching method. The source and drain electrodes 216a' and 216b' and the light reflector 116' may be respectively formed of two layers, but the present invention is not limited thereto and may be formed of more than two layers.

The etching rate of the metal of a plurality of layers forming the source and drain electrodes 216a' and 216b' and the light reflector 116' may increase toward a lower layer portion, for example, toward the first and second pixel electrodes 114 and 115. For example, a lower layer portion 116a' of the light reflector 116' may be formed of molybdenum, and upper layer portion 116b' of the light reflector 116' may include an aluminum alloy.

As such, when the lower layer portion 116a' of the light reflector 116' is formed of a material having a higher etching rate than the upper layer portion 116b' of the light reflector 116', an etching degree of the light reflector 116' increases from the upper layer portion 116b' toward the lower layer portion 116a', and thus the light reflector 116' has an inverse tapered shape, wherein the light reflector 116' narrows from the upper layer portion 116b' towards the lower layer portion 116a'. In one embodiment, the source and drain electrodes 216a' and 216b' may respectively have an inverse tapered shape.

When the light reflector 116' has the inverse tapered shape, light extraction efficiency of the organic light-emitting display device 3 is higher than that of the organic light-emitting display device 1 since more photons from among photons emitted in random directions from the emission layer 118 reach the light reflector 116', and light L2 that reaches the light reflector 116' is reflected so that more reflected light L2' is emitted to the outside the organic light-emitting display device 3.

The light reflector surrounding the periphery of the emission layer may efficiently increase the light extinction efficiency of the organic light-emitting display device.

According to an organic light-emitting display device and a method of manufacturing the same of the present invention, light extraction efficiency of the organic light-emitting display device can be increased by forming a light reflector around an emission layer, by using a metal having high reflexibility like that of source and drain electrodes. Also, manufacturing processes can be simplified since the light reflector is formed without having to perform a separate mask process. Moreover, the organic light-emitting display device, including the light reflector, can be manufactured by performing 5 mask processes.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display device, comprising:
an active layer of a thin film transistor formed on a substrate;
a gate electrode of the thin film transistor, wherein a first gate electrode comprising a transparent conductive material, a first insulating layer, and a second gate electrode comprising a metal are sequentially stacked;
a pixel electrode disposed on the first insulating layer and the pixel electrode comprising the transparent conductive material;
a source electrode and a drain electrode of the thin film transistor, which are electrically connected to the active layer, and a second insulating layer disposed between the source electrode and the drain electrode;
a light reflector comprising a same material as the source electrode and the drain electrode, the light reflector being disposed at an upper edge of the pixel electrode;
an emission layer emitting light, the emission layer being disposed on top of the pixel electrode and the emission layer being surrounded by the light reflector; and
a counter electrode facing towards the pixel electrode, wherein the emission layer is disposed between the pixel electrode and the counter electrode.

2. The organic light-emitting display device of claim 1, wherein the light reflector has a closed loop shape surrounding the emission layer.

3. The organic light-emitting display device of claim 1, wherein a thickness of the light reflector is equal to or greater than a thickness of the emission layer.

4. The organic light-emitting display device of claim 1, wherein a thickness of the light reflector is equal to each thickness of the source electrode and the drain electrode.

5. The organic light-emitting display device of claim 1, wherein the light reflector is formed inside an opening formed by etching the second insulating layer disposed on top of the pixel electrode.

6. The organic light-emitting display device of claim 1, wherein the light reflector has an inverse tapered shape in which the cross-sectional area of the light reflector gradually decreases towards the pixel electrode.

7. The organic light-emitting display device of claim 6, wherein the light reflector comprises at least two layers of a metal with each layer having different etching rates when the two layers are simultaneously etched by an etching method.

8. The organic light-emitting display device of claim 7, wherein, when the metal is etched by the etching method, the metal has a higher etching rate at a first portion of the metal which is disposed closer to the pixel electrode and has a lower etching rate at a second portion of the metal which is disposed farther away from the pixel electrode.

9. The organic light-emitting display device of claim 1, further comprising a third insulating layer disposed between the source and drain electrodes and the counter electrode, and between the light reflector and the emission layer.

10. The organic light-emitting display device of claim 1, further comprising a third insulating layer disposed between the source and drain electrodes and the counter electrode, and a fourth insulating layer disposed between the light reflector and the emission layer, wherein the fourth insulating layer has a higher light transmittance than the third insulating layer.

11. The organic light-emitting display device of claim 10, wherein the third insulating layer comprises an organic insulating material and the fourth insulating layer comprises an inorganic insulating material.

12. The organic light-emitting display device of claim 1, wherein the pixel electrode is formed by a same transparent conductive material forming the first gate electrode.

13. The organic light-emitting display device of claim 12, further comprising a second pixel electrode disposed on an upper edge of the transparent conductive material of the pixel electrode and the second pixel electrode comprising the same metal forming the second gate electrode,
wherein the light reflector is disposed on an inner side of the second pixel electrode, and the inner side of the second pixel electrode faces toward the emission layer.

14. The organic light-emitting display device of claim 12, wherein the transparent conductive material comprises at least one material selected from the group consisting of indium tin oxide (ITO), indium zinc oxide (IZO), zinc oxide (ZnO), indium oxide (In2O3), indium gallium oxide (IGO), aluminum zinc oxide (AZO) and the combinations thereof.

15. The organic light-emitting display device of claim 1, wherein end shapes of etched surfaces of the first and second gate electrodes are the same.

16. The organic light-emitting display device of claim 1, wherein the active layer comprises an ion impurity-doped semiconductor.

17. The organic light-emitting display device of claim 16, wherein the ion impurity-doped semiconductor comprises amorphous silicon or polysilicon.

18. The organic light-emitting display device of claim 1, further comprising:
a lower capacitor electrode comprising the same material as the active layer and formed on the same layer as the active layer; and
an upper capacitor electrode comprising the same material as the first gate electrode and being formed on the first insulating layer.

19. The organic light-emitting display device of claim 18, wherein the lower capacitor electrode comprises an ion impurity-doped semiconductor.

20. The organic light-emitting display device of claim 1, wherein the counter electrode is a reflective electrode that reflects light emitted from the emission layer.

21. A method of manufacturing an organic light-emitting display device, the method comprising: forming an active layer on a substrate; sequentially stacking a first insulating layer, a transparent conductive material, and a first metal layer on the active layer, and simultaneously forming a pixel electrode and a gate electrode of a thin film transistor by patterning the transparent conductive material and the first metal layer, the gate electrode comprising the transparent conductive material and the first metal layer; forming a second insulating layer on a first resultant structure obtained through the steps of sequential stacking the first insulating layer and the transparent conductive material and the first metal layer and simultaneous forming the pixel electrode and the gate electrode, and forming a first opening exposing the transparent conductive material of the pixel electrode and source and drain regions of the active layer by patterning the second insulating layer; forming a second metal layer on a second resultant structure obtained through steps of forming of the second insulating layer and forming of the first opening, and simultaneously forming source and drain electrodes which respectively contact the source and drain regions by patterning the second metal layer, and a light reflector disposed on the transparent conductive material of the pixel electrode, the light reflector comprising a same material as the source electrode and the drain electrode, the light reflector disposed at an upper edge of the pixel electrode; forming a third insulating layer on a third resultant structure obtained through steps of the forming of the second metal layer and simultaneous forming the source and drain electrodes and the light reflector, the third insulating layer exposing the transparent conductive material of the pixel electrode, forming an emission layer in a second opening formed within the third insulating layer, with the emission layer being surrounded by the light reflector; and forming a counter electrode covering the emission layer.

22. The method of claim 21, wherein in the steps of forming of the second metal layer and simultaneous forming the source and drain electrodes, the second metal layer comprises at least two metal layers having different etching rates, and the etching rate increases toward the pixel electrode.

23. The method of claim 21, wherein the step of forming of the third insulating layer further comprises forming a fourth insulating layer having a higher light transmittance than the third insulating layer and the fourth insulating layer being disposed between the second insulating layer and the third insulating layer, wherein the third and fourth insulating layers expose the transparent conductive material of the pixel electrode.

* * * * *